United States Patent
Hu

(10) Patent No.: US 9,659,885 B2
(45) Date of Patent: May 23, 2017

(54) SEMICONDUCTOR DEVICE WITH PRE-MOLDING CHIP BONDING

(71) Applicant: Chuan Hu, Chandler, AZ (US)

(72) Inventor: Chuan Hu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/493,718

(22) Filed: Sep. 23, 2014

(65) Prior Publication Data

US 2015/0008595 A1    Jan. 8, 2015

Related U.S. Application Data

(62) Division of application No. 13/598,352, filed on Aug. 29, 2012, now Pat. No. 8,872,355.

(51) Int. Cl.
*H01L 21/78* (2006.01)
*H01L 23/00* (2006.01)
*H01L 21/56* (2006.01)

(52) U.S. Cl.
CPC ............ *H01L 24/05* (2013.01); *H01L 21/561* (2013.01); *H01L 21/568* (2013.01); *H01L 24/82* (2013.01); *H01L 24/11* (2013.01); *H01L 24/13* (2013.01); *H01L 24/19* (2013.01); *H01L 24/20* (2013.01); *H01L 24/24* (2013.01); *H01L 2221/68381* (2013.01); *H01L 2224/02381* (2013.01); *H01L 2224/0401* (2013.01); *H01L 2224/04105* (2013.01); *H01L 2224/12105* (2013.01); *H01L 2224/131* (2013.01); *H01L 2224/24137* (2013.01); *H01L 2224/821* (2013.01); *H01L 2224/82002* (2013.01); *H01L 2224/8203* (2013.01); *H01L 2224/96* (2013.01); *H01L 2924/12042* (2013.01); *H01L 2924/181* (2013.01); *H01L 2924/35* (2013.01)

(58) Field of Classification Search
CPC ....... H01L 23/488; H01L 21/60; H01L 21/78; H01L 21/304; H01L 21/561; H01L 21/568; H01L 21/4853; H01L 21/486; H01L 21/565
USPC .......... 257/783, 738, E21.599, E21.505, 690
See application file for complete search history.

(56) References Cited

U.S. PATENT DOCUMENTS

| 8,872,355 | B2 | 10/2014 | Hu | |
|---|---|---|---|---|
| 2009/0045513 | A1* | 2/2009 | Kim | ...................... H01L 21/568 257/738 |
| 2010/0019368 | A1* | 1/2010 | Shin | .............................. 257/686 |

(Continued)

OTHER PUBLICATIONS

"U.S. Appl. No. 13/598,352, Final Office Action mailed Feb. 28, 2014", 7 pgs.

(Continued)

*Primary Examiner* — Chuong A Luu
*Assistant Examiner* — Rodolfo D Fortich
(74) *Attorney, Agent, or Firm* — Schwegman Lundberg & Woessner, P.A.

(57) ABSTRACT

This disclosure relates generally to a semiconductor device and method of making the semiconductor device by pressing an electrical contact of a chip into a bonding layer on a carrier. The bonding layer is cured and coupled, at least in part, to the electrical contact. A molding layer is applied in contact with the chip and a first major surface of the bonding layer. Distribution circuitry is coupled to the electrical contact.

11 Claims, 5 Drawing Sheets

(56) References Cited

U.S. PATENT DOCUMENTS

2010/0133680 A1 6/2010 Kang et al.
2011/0001247 A1* 1/2011 Jobetto .................. 257/774
2014/0061954 A1 3/2014 Hu

OTHER PUBLICATIONS

"U.S. Appl. No. 13/598,352, Non Final Office Action mailed Aug. 22, 2013", 7 pgs.
"U.S. Appl. No. 13/598,352, Notice of Allowance mailed Jun. 23, 2014", 8 pgs.
"U.S. Appl. No. 13/598,352, Response filed May 28, 2014 to Final Office Action mailed Feb. 28, 2014", 5 pgs.
"U.S. Appl. No. 13/598,352, Response filed Jun. 24, 2013 to Restriction Requirement mailed May 24, 2013", 4 pgs.
"U.S. Appl. No. 13/598,352, Response filed Dec. 23, 2013 to Non Final Office Action mailed Aug. 22, 2013", 9 pgs.
"U.S. Appl. No. 13/598,352, Restriction Requirement mailed May 24, 2013", 5 pgs.

* cited by examiner

SEMICONDUCTOR DEVICE WITH PRE-MOLDING CHIP BONDING

This application is a divisional of U.S. patent application Ser. No. 13/598,352, filed on Aug. 29, 2012, which is incorporated herein by reference in its entirety.

TECHNICAL FIELD

The disclosure herein relates generally semiconductor devices and, more particularly, to pre-molding chip bonding and methods therefor.

BACKGROUND ART

Semiconductor devices may incorporate a chip or die seated in a molding layer. Electrical contacts of the chip or die provide input and output connectivity with the chip or die. Distribution circuitry may provide a useable interface with and between the electrical contacts. A bonding layer and a buildup layer may provide strain relief and stability for the electrical contacts and the distribution circuitry.

DESCRIPTION OF THE EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Certain semiconductor devices may incorporate a bonding layer. A molding process and/or a wafer-level underfill process may apply the bonding layer by flowing the bonding layer between and among the electrical contacts of a chip. However, flowing the bonding layer may result in inconsistent application of the bonding layer and potentially undesirable stresses on the electrical contacts, such as when the bonding layer is cured. For instance, a semiconductor device that incorporates multiple chips may have an anticipated alignment accuracy between the chips and the electrical connections of the chips of approximately fifteen (15) micrometers. As a result, processes that incorporate relatively fine lines in the distribution circuitry, such as approximately two (2) micrometer lines and spaces between the lines, may be relatively unreliable between two chips in a single semiconductor device, given the discrepancy between the tolerance on chip positioning and the size of the lines and spaces.

Figure 1:
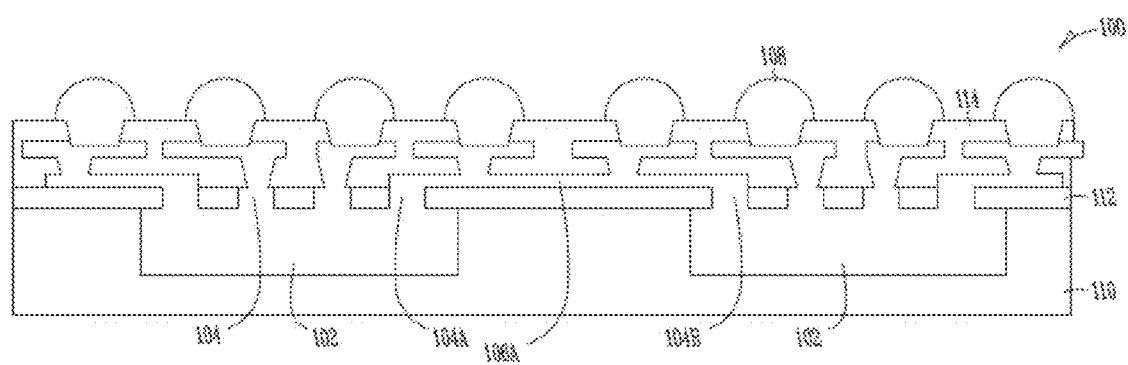
FIG. 1 is a stylized side profile of a semiconductor device.

FIG. 1 is a side profile of a semiconductor device 100. The semiconductor device 100 as illustrated includes two components 102, such as a chip, a die, or other component, such as may be fabricated from silicon. The semiconductor device 100 may include only one chip 102 or more than two chips 102. Each chip 102 includes at least one electrical contact 104. Distribution circuitry 106 is coupled to the electrical contact 104. A solder bump 108 is optionally coupled to the distribution circuitry 106. The distribution circuitry 106a optionally couples one electrical contact 104a of one chip 102 to a second electrical contact 104b of a second chip 102. Taken together, the electrical contact 104, the distribution circuitry 106 and the solder bump 108 provide input and output connectivity with the respective chips 102.

A molding layer 110 may provide general mechanical stability for the semiconductor device 100 as well as secure the chips 102 with respect to one another and the rest of the components of the semiconductor device 100. A bonding layer 112 may provide mechanical stability for the electrical contacts 104, and optionally the chips 102 and the distribution circuitry 106. A buildup layer 114 may provide mechanical stability for the distribution circuitry 106. The molding layer 110, the bonding layer 112, and the buildup layer 114 may combine to provide general mechanical stability for the semiconductor device 100 generally and any or all of the components of the semiconductor device 100.

The molding layer 110 may be a molding compound for use with semiconductor devices. The molding compound can include or be made of a material with a relatively very high filler content, such as a weight percentage of from sixty (60) to ninety (90) percent. The molding compound can include a mix of organic material such as epoxy and/or an inorganic filler, such as $SiO_2$, SiC, and AlN. The bonding layer 112 may be the same or similar material as is used in wafer-level underfill processes. The buildup layer 114 may include a buildup material such as epoxy with filler, liquid crystal polymer, polyimide, $SiO_2$, and other organic or inorganic dielectric materials. The molding layer 110, bonding layer 112, and buildup layer 114 may perform the same or similar functions.

In contrast with, for instance, the wafer-level underfill process, however, the bonding layer 112 of the semiconductor device 100 is not flowed around the electrical contacts 104. Rather, the electrical contacts 104 and the chip 102 generally is pressed or otherwise inserted into the bonding layer 112 by a compression force before the bonding layer 112 has cured. Because the chip 102 or chips 102 are pressed into the bonding layer 112, the relative position of the chips with respect to the bonding layer 112 may be relatively more precisely controlled than may be achieved through other bonding layer 112 application processes.

The bonding layer 112, as cured, may produce lessened or differently-distributed stresses, such as on the electrical contacts 104, than may be achieved with a wafer-level underfill process under certain circumstances. Additionally, the semiconductor device 100 generally may incorporate less warpage than may be achieved through wafer-level underfill, may enable bumped silicon, and may provide for increased positioning accuracy of the chip or chips 102.

FIGS. 2a-2g illustrate an exemplary sequential process flow for making the semiconductor device 100. The building of the semiconductor device 100 is not limited only to the process flow of FIGS. 2a-2g, but rather may incorporate any of a variety of process steps that may produce the semiconductor device 100.

Figure 2A:
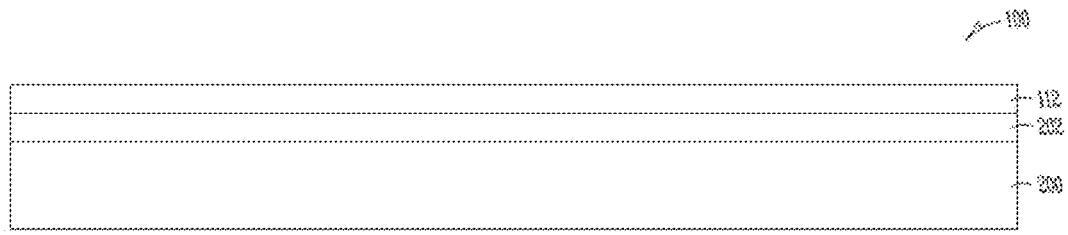
FIGS. 2a-2g an exemplary sequential process flow for making a semiconductor device.

In FIG. 2a, a carrier layer 200, an adhesive layer 202, and the bonding layer 112 are provided. The carrier layer 200 may provide mechanical stability for the semiconductor device 100, such as during the manufacturing process. The carrier layer 200 may be comprised of any of a variety of materials that have or may be utilized in the manufacture of semiconductor devices generally. In various examples, the carrier layer 200 is comprised of stainless steel, glass, ceramic, silicon, and other similar or suitable materials.

The adhesive layer 202 adheres the carrier layer 200 with respect to the bonding layer 112. The adhesive layer 202 and the bonding layer 112 may together be provided as a die attach film 203. The adhesive layer 202 may include a debondable adhesive. In various examples, the debondable adhesive may be a thermo-releasable adhesive, a ultraviolet-releasable adhesive, a laser-releasable adhesive, a chemically-releasable adhesive, or other suitable debondable adhesive.

In various examples, the bonding layer 112 is an epoxy. In an example, the epoxy is a B-staged epoxy or a polyamide epoxy. In an example, the bonding layer is an SU-8 photoresist. The bonding layer 112 may include a filler that may provide additional mechanical strength. The thickness of the bonding layer 112 may be at least as great as the height of the electrical contact relative to the rest of the chip 102. Alternatively or additionally, the thickness of the bonding layer 112 may be based on the size of other components of the semiconductor device 100, such as the distribution circuitry 106.

Figure 2B:
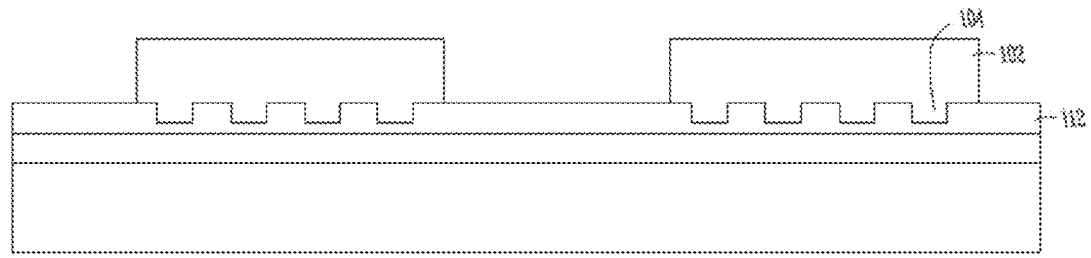

In FIG. 2b, the electrical contacts 104 of the chips 102 are pressed into the bonding layer 112. In an example, the electrical contacts 104 may be inserted into the bonding layer 112 by compression. The insertion may be performed at room temperature. In certain examples, the bonding layer 112 may be heated to promote insertion of the electrical contacts 104. Heating of the bonding layer 112 and the selection of the materials of the bonding layer 112 in general may be based, at least in part, a viscosity sufficient to admit the electrical contacts 104 while maintaining adequate opposing force on the electrical contacts.

In the illustrated example, a portion of the chips 102 in addition to the electrical contacts 104 of the chips are pressed into the bonding layer 112. In various examples, the electrical contacts 104 are pressed into the bonding layer 112 only sufficiently to cover the electrical contacts 104 in the bonding layer 112. Alternatively, and as illustrated, a portion of the rest of the chips 102 may be pressed into the bonding layer 112. Pressing a portion of the chips 102 into the bonding layer 112 in addition to the electrical contact 104 may increase an amount of the electrical contacts 104 that are covered by the bonding layer 112 and, in various examples, increase an extent to which the bonding layer 112 secures the chips 102. In various examples, the bonding layer 112 mechanically secures the chips 102 by creating a mechanical interface at least between the bonding layer 112 and the electrical interconnects 104. In various examples, the bonding layer 112 alternatively or additionally adhesively secures the chips 102 by adhering with at least the electrical interconnects 104.

Figure 2C:
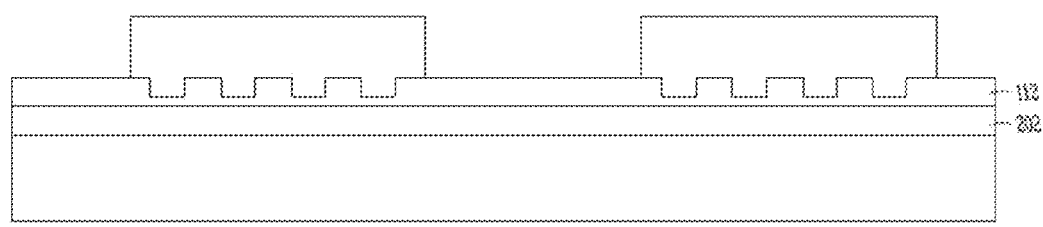

In FIG. 2c, the bonding layer 112 is cured. In an example, the bonding layer 112 is cured by applying heat. In such an example, the bonding layer 112 may be cured at a temperature less than a thermal breakdown temperature of the adhesive layer 202, in examples where the adhesive layer 202 is thermo-releasable. The bonding layer 112 may be substantially fully cured, such as by reducing a reactivity of the material of the bonding layer 112 to less than one (1) percent. A bonding layer 112 into which the electrical interconnects 104 have been pressed may be identified by cross-linking free radicals in an organic resin on the bonding layer 112 from less than sixty (60) percent to over ninety-nine (99) percent.

Figure 2D:
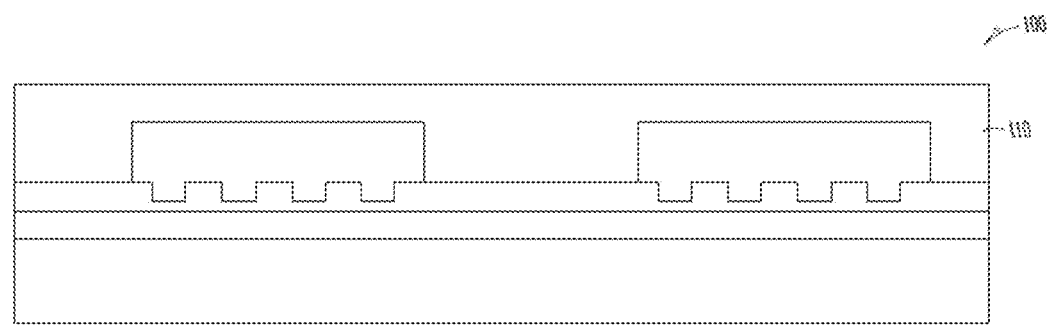

In FIG. 2d, the molding layer 110 is applied to the semiconductor device 100. In an example, the molding layer 110 is applied by pressure molding. The molding layer may be applied to an entire wafer or selectively to a portion of a wafer or particular semiconductor device 100.

Figure 2E:
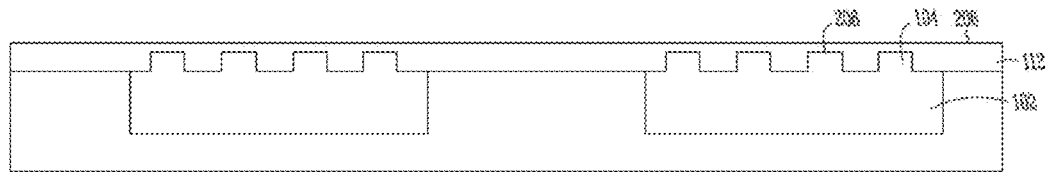

In FIG. 2e, the adhesive layer 202 is debonded and the carrier 200 removed. Debonding the adhesive layer 202 exposes a surface 206 of the bonding layer 112. In various examples, such as where a chip 102 has been pressed into the bonding layer 112 such that the depth of penetration of the electrical contacts 104 is the same as the thickness of the bonding layer 112, the surface 208 (FIG. 2f below) of one or more electrical contacts 104 may also be exposed.

Figure 2F:

In FIG. 2f, the now-exposed surface 206 of the bonding layer 112 is planarized. The bonding layer 112 may be planarized to expose the surface 208 of the electrical contacts 104. Planarization may expose all of the electrical contacts 104 and may provide substantially co-planar surfaces 208 of the electrical contacts 104. Co-planarity of the surfaces 208 may be on the micron-level. Planarization may be achieved through grinding, polishing, or other methods.

Figure 2G:
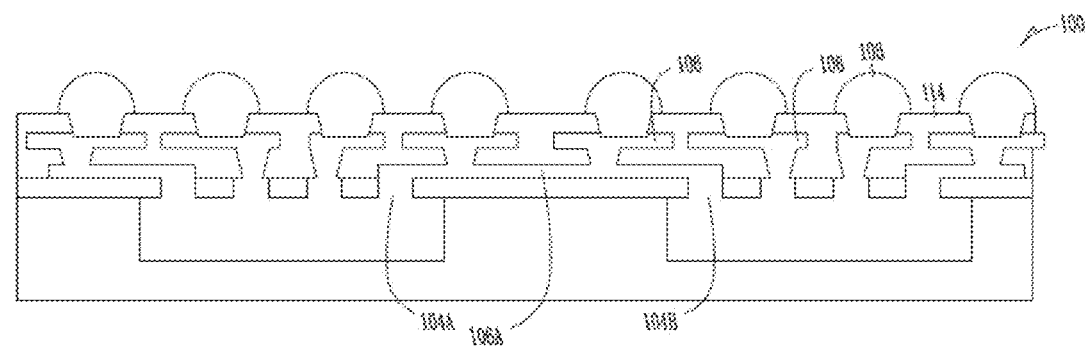

In FIG. 2g, the semiconductor device 100 is built up by adding the distribution circuitry 106, the buildup layer 114, and the solder bumps 108. In an example, the distribution circuitry 106a connects at least one electrical contact 104a to another electrical contact 104b.

Figure 3:
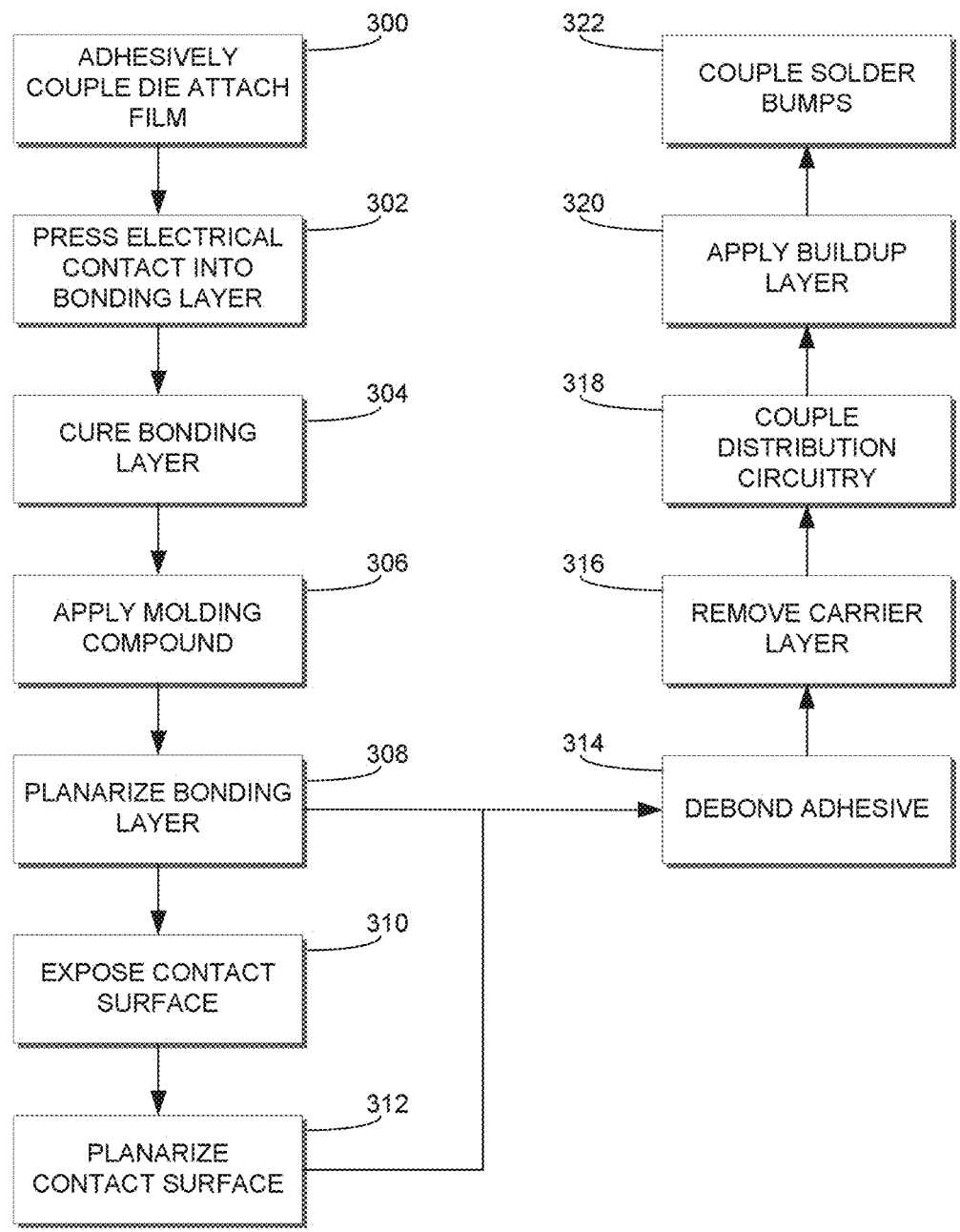
FIG. 3 is a flow chart for making the semiconductor device in accordance with some embodiments.

FIG. 3 is a flowchart for producing a device, such as the semiconductor device 100. It is noted that the flowchart is not limited only to making the semiconductor device 100.

At 300, the die attach film 203 is attached to the carrier layer 200. Where the die attach film 203 includes the adhesive layer 202, the die attach film 203 is attached to the carrier 200 by adhesively coupling the adhesive layer 202 to the carrier layer 200. Alternatively, the adhesive layer 202 and bonding layer 112 may be separately and individually adhesively coupled with respect to the carrier layer 200.

At 302, the electrical contact 104 of the chip 102 is pressed or otherwise inserted by compression into the bonding layer 112 on the carrier 200.

At 304, the bonding layer 112 is cured. In the illustrated example, the bonding layer 112 is cured after the electrical contact 104 is pressed into the bonding layer 112. Upon being cured, the electrical contact 104 may be coupled, at least in part, to the bonding layer 112. In an example, the coupling between the electrical contact 104 and the bonding layer 112 substantially secures the electrical contact 104 specifically and the chip 102 generally with respect to the bonding layer 112 so that the chip 102 does not move with respect to the bonding layer 112 under normal forces. The molding layer 110 may contribute to substantially securing the chip 102 with respect to the bonding layer 112.

At 306, a molding compound of the molding layer 110 is applied in contact with the chip 102 and a first major surface of the bonding layer 112. The molding layer 110 may contribute mechanical rigidity to the semiconductor device 100 and may further secure the chip 102 with respect to the bonding layer 112.

At 308, the bonding layer 112 is planarized. The bonding layer 112 may be planarized by polishing, grinding, or other methods that would be apparent to one of ordinary skill in the art.

At 310, the bonding layer 112 may be planarized until the contact surface 208 of the electrical contact 104 is exposed. Exposing the electrical contact 104 may be performed if the contact surface 208 is not already exposed.

At 312, planarizing the bonding layer 112 further includes planarizing the electrical contact 104 or some or all of the electrical contacts 104. The electrical contacts 104 may be planarized until the contact surfaces 208 of the electrical contacts 104 are substantially co-planar.

At 314, the adhesive layer 202 is debonded. In various examples, the adhesive layer 202 is debonded by applying a stimulant based on the nature of the adhesive layer 202. In an example, such as where the adhesive layer 202 is a thermo-releasable adhesive, debonding the adhesive layer 202 includes applying heat to the adhesive layer 202. In an example, such as where the adhesive layer 202 is a ultra-violet releasable adhesive, debonding the adhesive layer 202 includes applying ultra-violet energy to the adhesive layer 202.

At 316, the carrier layer 200 is removed from the semiconductor device 100.

At 318, the distribution circuitry 106 is coupled to the contact surface 208 of at least one of the electrical contacts 104.

At 320, the buildup layer 114 is applied to a second major surface of the bonding layer 112 opposite the first major surface. The buildup layer 114 may contribute to the mechanical rigidity of the semiconductor device 100 and substantially surround and provide mechanical support to the distribution circuitry 106.

At 322, the solder bumps 108 are coupled to the distribution circuitry 106.

Figure 4:
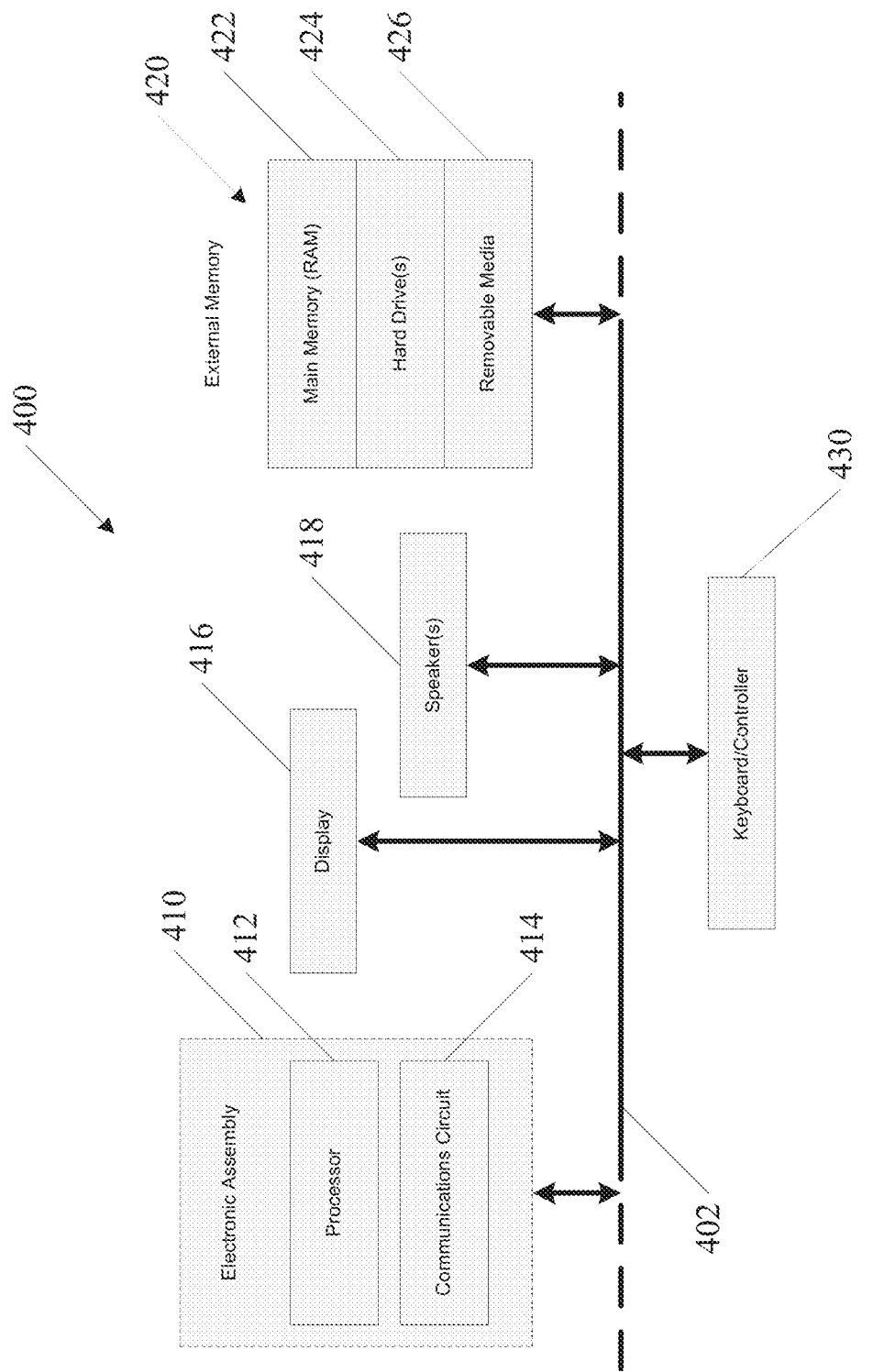
FIG. 4 is a block diagram of an electronic device incorporating at least one chip with at least one electrical interconnect in accordance with some embodiments.

An example of an electronic device using semiconductor chips and elongated structures as described in the present disclosure is included to show an example of a higher level device application. FIG. 4 is a block diagram of an electronic device 400 incorporating at least semiconductor device 100. The electronic device 400 is merely one example of an electronic system in which embodiments of the present disclosure may be used. Examples of electronic devices 400 include, but are not limited to personal computers, tablet computers, mobile telephones, personal data assistants, MP3 or other digital music players, etc. In this example, the electronic device 400 comprises a data processing system that includes a system bus 402 to couple the various components of the system. The system bus 402 provides communications links among the various components of the electronic device 400 and may be implemented as a single bus, as a combination of busses, or in any other suitable manner.

An electronic assembly 410 is coupled to the system bus 402. The electronic assembly 410 may include any circuit or combination of circuits. In one embodiment, the electronic assembly 410 includes a processor 412 which may be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in the electronic assembly 410 are a custom circuit, an application-specific integrated circuit (ASIC), or the like, such as, for example, one or more circuits (such as a communications circuit 414) for use in wireless devices like mobile telephones, pagers, personal data assistants, portable computers, two-way radios, and similar electronic systems. The IC may perform any other type of function.

The electronic device 400 may also include an external memory 420, which in turn may include one or more memory elements suitable to the particular application, such as a main memory 422 in the form of random access memory (RAM), one or more hard drives 424, and/or one or more drives that handle removable media 426 such as compact disks (CD), digital video disk (DVD), and the like.

The electronic device 400 may also include a display device 416, one or more speakers 418, and a keyboard and/or controller 430, which may include a mouse, trackball, touch screen, voice-recognition device, or any other device that permits a system user to input information into and receive information from the electronic device 400.

ADDITIONAL EXAMPLES

In Example 1 a method of making a semiconductor device comprises pressing an electrical contact of a chip into a bonding layer on a carrier, curing the bonding layer, wherein the bonding layer, as cured, is coupled, at least in part, to the electrical contact, applying a molding compound in contact with the chip and a first major surface of the bonding layer, and coupling distribution circuitry to the electrical contact.

In Example 2, the method of Example 1 optionally further comprises, prior to coupling the distribution circuitry, planarizing the bonding layer.

In Example 3, the method of any one or more of Examples 1 and 2 optionally planarizes the bonding layer by exposing a contact surface of the electrical contact, and coupling the distribution circuitry couples the distribution circuitry to the contact surface.

In Example 4, the method of any one or more of Examples 1-3 optionally planarizes the bonding layer by planarizing the electrical contact to expose the contact surface of the electrical contact.

In Example 5, the method of any one or more of Examples 1-4 optionally includes the chip comprising a plurality of electrical contacts, wherein pressing the electrical contact optionally comprises pressing the plurality of electrical contacts into the bonding layer, and planarizing the electrical contact optionally comprises planarizing the plurality of electrical contacts to make contact surfaces of the electrical contacts substantially co-planar.

In Example 6, the method of any one or more of Examples 1-5 optionally further comprises, prior to pressing the electrical contact into the bonding layer, attaching a die attach film to the carrier layer, the die attach film comprising the bonding layer and, prior to coupling the distribution circuitry, removing the carrier layer.

In Example 7, the method of any one or more of Examples 1-6 optionally includes the die attach film comprising an adhesive layer adhesively coupled to the bonding layer, and attaching the die attach film to the carrier layer optionally comprises adhesively coupling the adhesive layer to the carrier layer.

In Example 8, the method of any one or more of Examples 1-7 optionally includes the adhesive layer is comprised of a debondable adhesive, and the removing the carrier layer optionally comprises debonding the adhesive.

In Example 9, the method of any one or more of Examples 1-8 optionally includes that the debondable adhesive is one of a thermo-releasable adhesive and an ultra-violet-releasable adhesive, and debonding the adhesive optionally comprises applying at least one of heat and ultra-violet energy.

In Example 10, the method of any one or more of Examples 1-9 optionally further comprises applying a buildup layer on a second major surface of the bonding layer opposite the first major surface and substantially surrounding the distribution circuitry.

In Example 11, the method of any one or more of Examples 1-10 optionally further comprises coupling solder bumps to the distribution circuitry, wherein the buildup layer secures, in part, the solder bumps.

Example 12 may include subject matter (such as an apparatus, a method, a means for performing acts) that may include a semiconductor device, comprising a chip including an electrical contact, a cured bonding layer into which the electrical contact has been pressed and at least partially secured, a molding compound in contact with the chip and a first major surface of the bonding layer, and distribution circuitry electrically coupled to the electrical contact.

In Example 13, the device of Example 12 optionally comprises a plurality of electrical contacts each having been pressed into the bonding layer, wherein the plurality of electrical contacts are substantially co-planar.

In Example 14, the device of any one or more of Examples 12 and 13 optionally includes that the chip is a first chip and that the semiconductor device optionally further comprises a second chip including an electrical contact that has been pressed into the bonding layer, wherein the distribution circuitry electrically couples the electrical contact of the first chip to the electrical contact of the second chip.

In Example 15, the device of any one or more of Examples 12-14 optionally includes that the electrical contacts have been pressed into the bonding layer to a substantially similar depth of the bonding layer.

Example 16 may include subject matter (such as an apparatus, a method, a means for performing acts) that may include a semiconductor device, comprising a carrier layer, a substantially uncured bonding layer, a debondable adhesive layer positioned between the carrier layer and the bonding layer, the carrier layer and the bonding layer being adhesively coupled to the adhesive layer, and a chip comprising an electrical contact pressed into the bonding layer.

In Example 17, the device of Example 16 optionally includes that the adhesive layer is configured to release the carrier layer with respect to the bonding layer upon the adhesive layer being debonded.

In Example 18, the device of any one or more of Examples 16 and 17 optionally includes that the debondable adhesive layer comprises one of a thermo-releasable adhesive and an ultra-violet-releasable adhesive, and wherein the adhesive layer is debonded upon application of at least one of heat and ultra-violet energy.

In Example 19, the device of any one or more of Examples 16-18 optionally includes that the chip comprises a plurality of electrical contacts each having been pressed into the bonding layer.

In Example 20, the device of any one or more of Examples 16-19 optionally includes that the bonding layer is a polyamide epoxy.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the disclosure can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the disclosure should be determined with reference to the appended claims, along with the full scope of equivalents to which such claims are entitled.

What is claimed is:

1. A semiconductor device, comprising:
    a carrier layer;
    a substantially flat bonding layer having a material reactivity of less than approximately one percent;
    a debondable adhesive layer positioned between the carrier layer and the bonding layer, the carrier layer and the bonding layer being adhesively coupled to the adhesive layer; and
    a chip comprising an electrical contact buried into the bonding layer.

2. The semiconductor device of claim 1, wherein the adhesive layer is configured to release the carrier layer with respect to the bonding layer upon the adhesive layer being debonded.

3. The semiconductor device of claim 2, wherein the debondable adhesive layer comprises one of a thermo-releasable adhesive and an ultra-violet-releasable adhesive configured to debond upon application of at least one of heat and ultra-violet energy.

4. The semiconductor device of claim 1, wherein the chip comprises a plurality of electrical contacts each having approximately two (2) micrometers of separation between one another.

5. The semiconductor device of claim 1, wherein the bonding layer is a polyamide epoxy.

6. A semiconductor device, comprising:
- a carrier layer;
- a substantially flat bonding layer having a material reactivity of less than approximately one percent;
- a debondable adhesive layer positioned between the carrier layer and the bonding layer, the carrier layer and the bonding layer being adhesively coupled to the adhesive layer;
- a chip comprising an electrical contact buried into the bonding layer; and
- a buildup layer on a second major surface of the bonding layer opposite the first major surface and substantially surrounding the distribution circuitry.

7. The semiconductor device of claim 6, further comprising solder bumps coupled to the distribution circuitry, wherein the buildup layer secures, in part, the solder bumps.

8. The semiconductor device of claim 6, wherein the adhesive layer is configured to release the carrier layer with respect to the bonding layer upon the adhesive layer being debonded.

9. The semiconductor device of claim 6, wherein the debondable adhesive layer comprises one of a thermo-releasable adhesive and an ultra-violet-releasable adhesive configured to be debonded upon application of at least one of heat and ultra-violet energy.

10. The semiconductor device of claim 6, wherein the chip comprises a plurality of electrical contacts each having approximately two (2) micrometers of separation between one another.

11. The semiconductor device of claim 6, wherein the bonding layer is a polyamide epoxy.

* * * * *